(12) United States Patent
Hori

(10) Patent No.: US 7,941,476 B2
(45) Date of Patent: May 10, 2011

(54) METHOD OF DESIGNING PASSIVE RC COMPLEX FILTER OF HARTLEY RADIO RECEIVER

(75) Inventor: Kazuyuki Hori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1033 days.

(21) Appl. No.: 11/667,548

(22) PCT Filed: Nov. 19, 2004

(86) PCT No.: PCT/JP2004/017644
§ 371 (c)(1),
(2), (4) Date: May 11, 2007

(87) PCT Pub. No.: WO2006/054364
PCT Pub. Date: May 26, 2006

(65) Prior Publication Data
US 2008/0010617 A1    Jan. 10, 2008

(51) Int. Cl.
*G06G 7/02* (2006.01)
(52) U.S. Cl. ...................................................... 708/819
(58) Field of Classification Search .................. 708/819
See application file for complete search history.

(56) References Cited

U.S. PATENT DOCUMENTS

| | | | |
|---|---|---|---|
| 6,212,540 B1 * | 4/2001 | Murakami et al. | 708/819 |
| 6,529,100 B1 | 3/2003 | Okanobu | |
| 6,854,005 B2 * | 2/2005 | Thiele | 708/819 |
| 2006/0106906 A1 * | 5/2006 | Shabra et al. | 708/300 |

FOREIGN PATENT DOCUMENTS

| | | |
|---|---|---|
| JP | 08-065083 | 8/1994 |
| JP | 2001-045080 | 7/1999 |
| JP | 2001-077648 | 9/1999 |
| JP | 2004-108792 | 9/2002 |

OTHER PUBLICATIONS

International Search Report of PCT/JP2004/017644 mailed Mar. 8, 2005.
Yoshiki Niki et al., "Analysis and Design of RC Polyphase Filters", The Institute of Electronics, Information and Communication Engineers, Technical Report of IEICE (2003), pp. 35-40.

(Continued)

*Primary Examiner* — Tan V Mai
(74) *Attorney, Agent, or Firm* — Stites & Harbison PLLC; Juan Carlos A. Marquez, Esq.

(57) ABSTRACT

An object of this invention is to provide a method of designing a complex transfer function which can be realized in a passive RC complex filter at the same time while perfectly succeeding to features of a prototype lowpass characteristic. In this invention, as a first step, a prototype lowpass characteristic $F(p)$ having a pole on a unit circle is designed. Next, as a second step, a bilinear variable transformation expressed by $p=j(s-j)/(s+j)$ is performed with respect to the prototype characteristic $F(p)$ to derive a complex coefficient transfer function $G(s)$. As a third step, a passive RC complex filter $H(s)$ is designed based upon the complex coefficient transfer function $G(s)$.

8 Claims, 12 Drawing Sheets designing flow chart of this invention

OTHER PUBLICATIONS

Junya Fukura et al., "Analysis of RC Polyphase Filter by Using Multi-Port F-Matrix", ECT-02-71, the Institute of Electrical Engineers of Japan, pp. 23-26, in Japanese with English abstract.

Yukio Kagawa, "Analogue/Digital Filter", First Edition, Kagaku Gijutsu Shuppansha, Dec. 25, 1981, Ch. 5, pp. 62-70, in Japanese.

Haruo Kobayashi et al., "Explicit Transfer Function of RC Polyphase Filter for Wireless Transceiver Analog Front-End", 2002 IEEE Asia-Pacific Conference on ASICs, 4 pages.

Jan Crols et al., "Low-IF Topologies for High-Performance Analog Front Ends of Fully Integrated Receivers", IEEE Transactions of Circuits and Systems-II, Analog and Digital Signal Processing, vol. 45, No. 3, Mar. 1998, pp. 269-282.

Kazuyuki Wada et al., "RC Polyphase Filter With Flat Gain Characteristic", Proceedings of the 2003 IEEE International Symposium on Circuits and Systems, vol. 1, pp. 537-540.

* cited by examiner

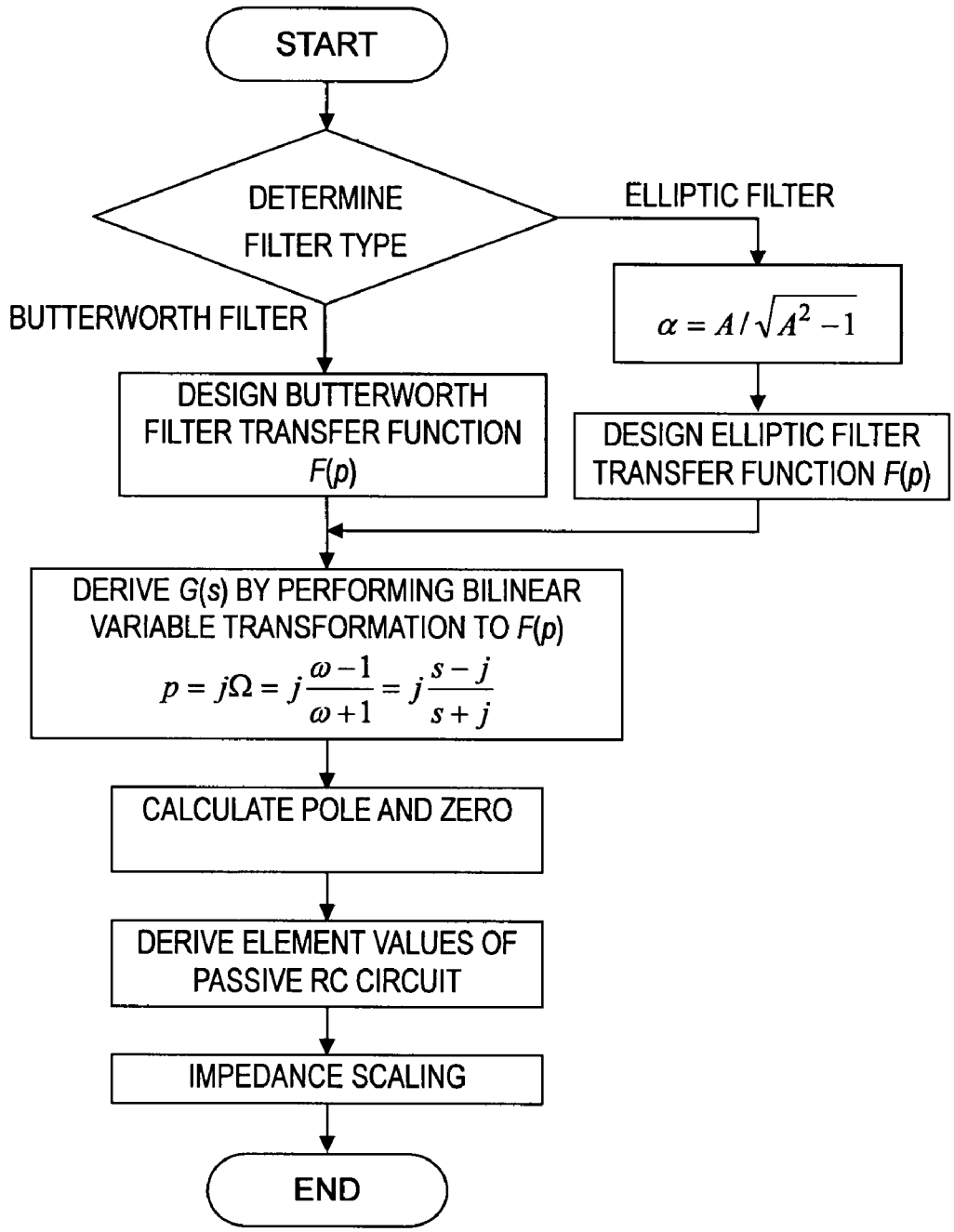
Fig. 1 designing flow chart of this invention

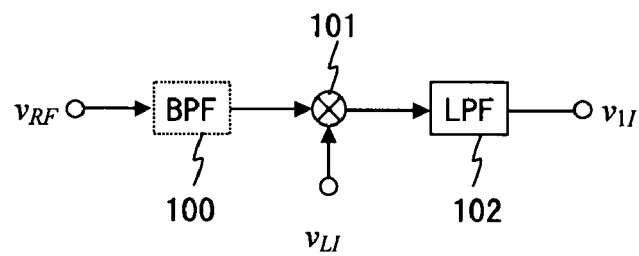
*Fig. 2* heterodyne receiver
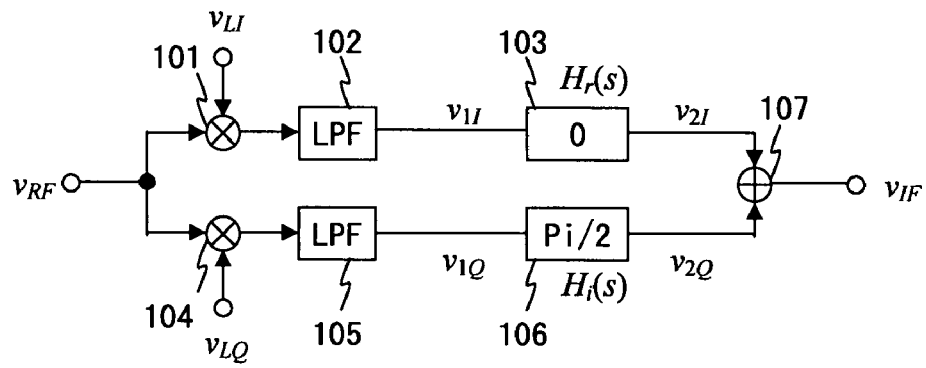
*Fig. 3* Hartley receiver
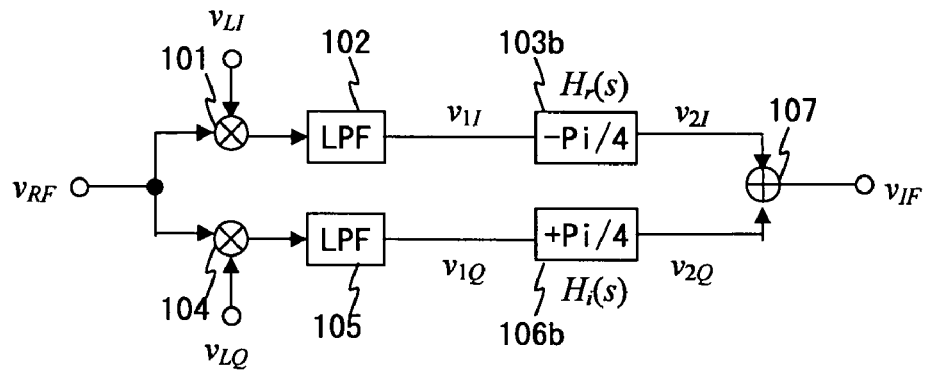
*Fig. 4* another embodiment of a Hartley receiver

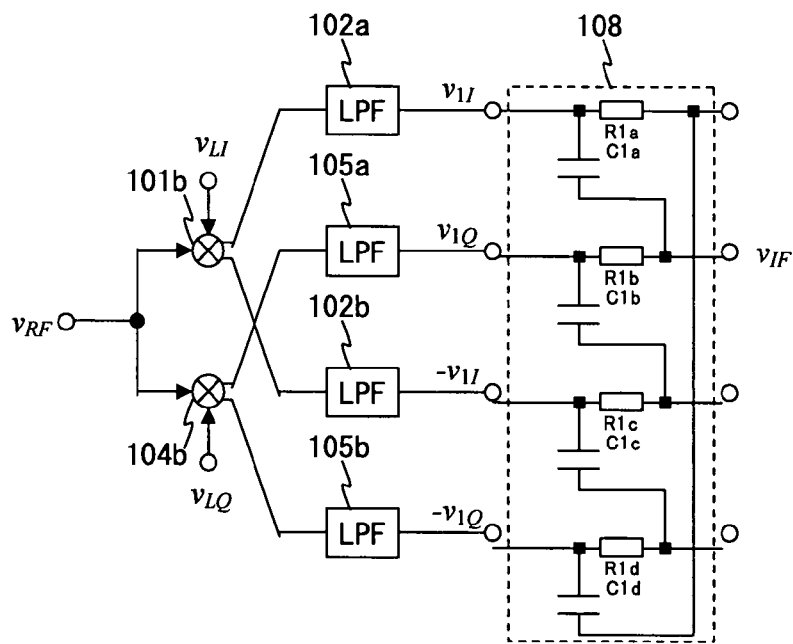
Fig. 5 polyphase structure of the Hartley receiver
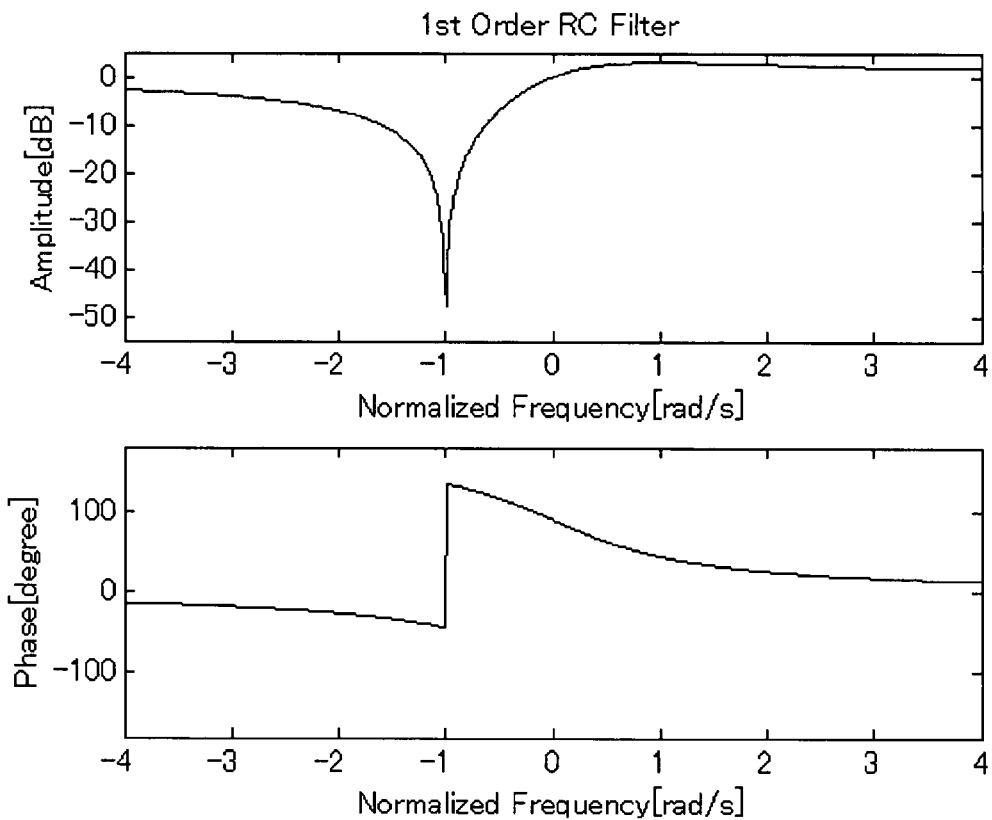
Fig. 6 frequency response of a first-order complex filter

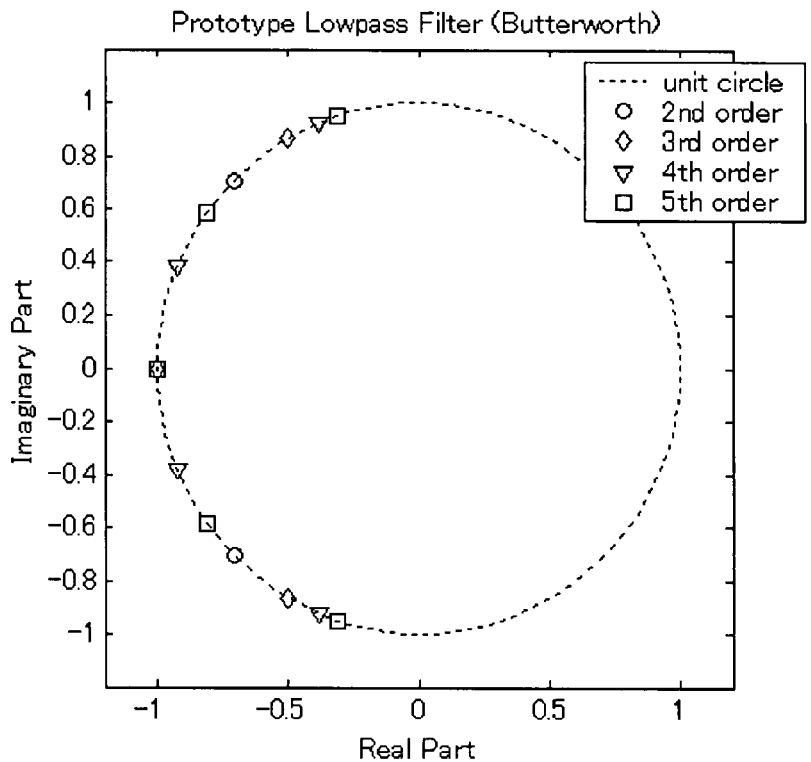
*Fig. 7* pole location of a Butterworth filter
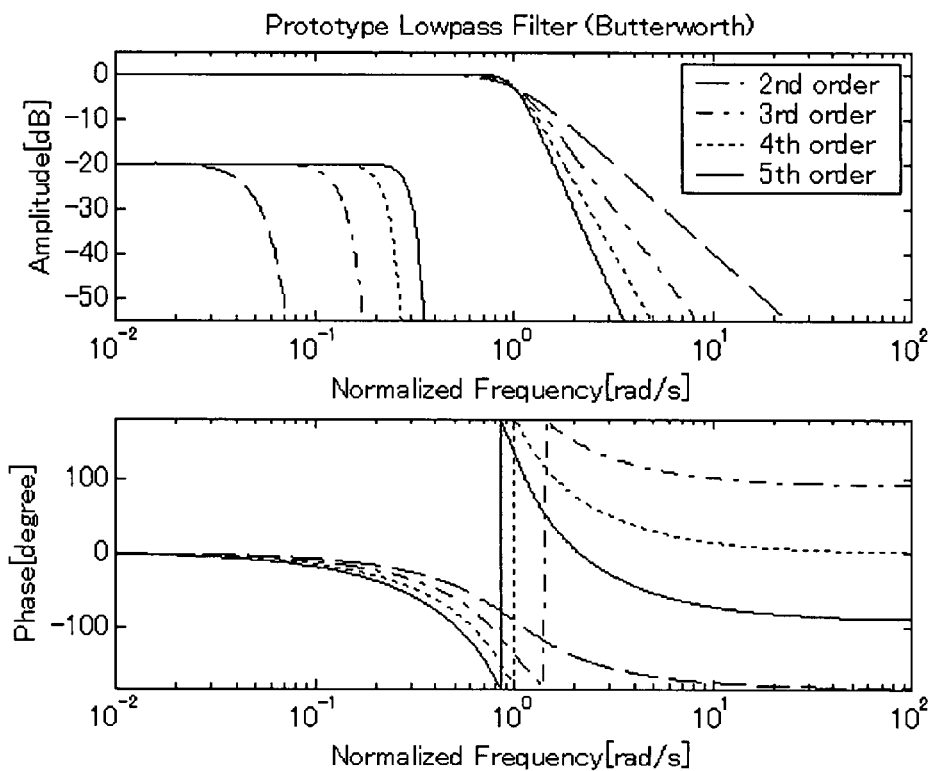
*Fig. 8* frequency response of the Butterworth filter

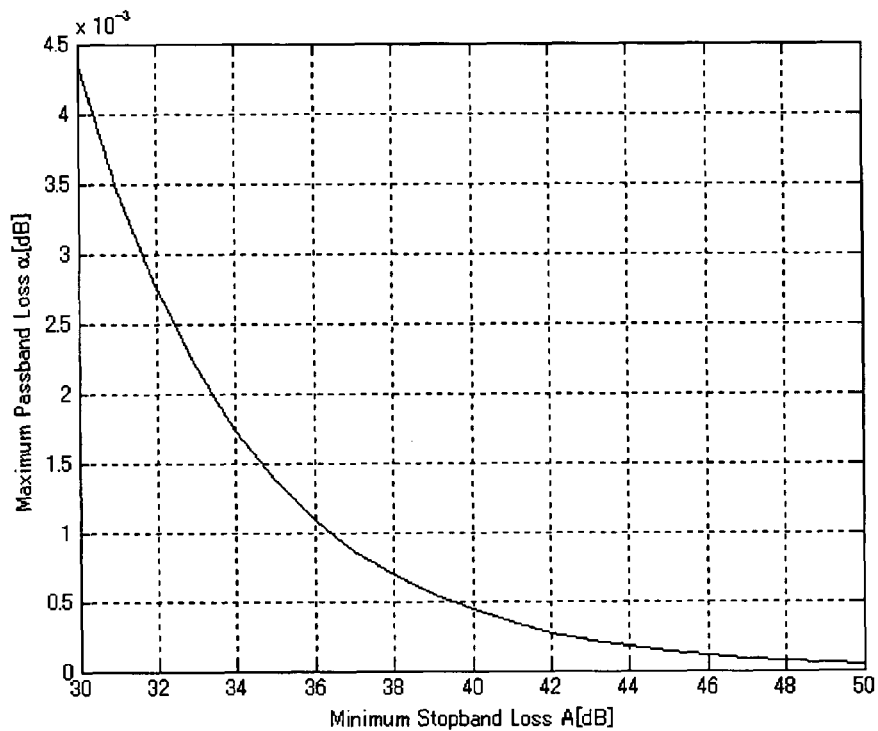
relationship to be satisfied by a maximum passband loss "α" and a minimum stopband loss "A"
Fig. 9
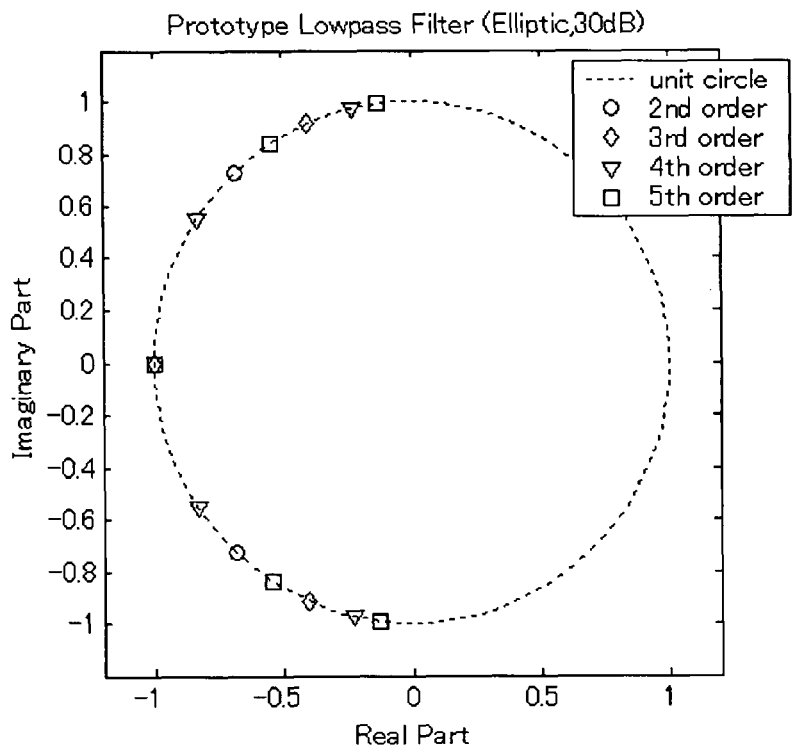
Fig. 10   pole location of an elliptic filter ($A = 30$ dB)

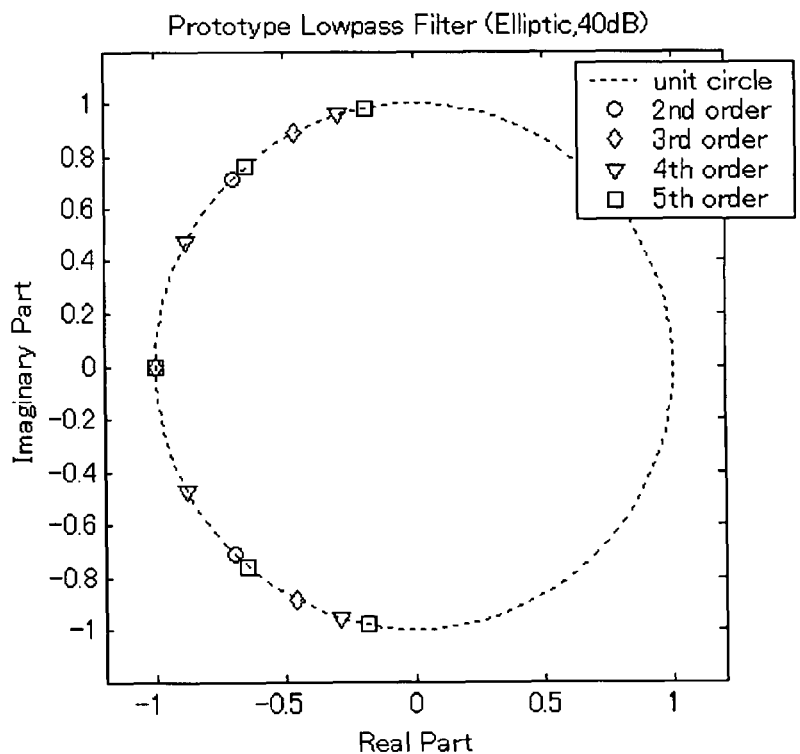
*Fig. 11* pole location of an elliptic filter (*A* = 40 dB)
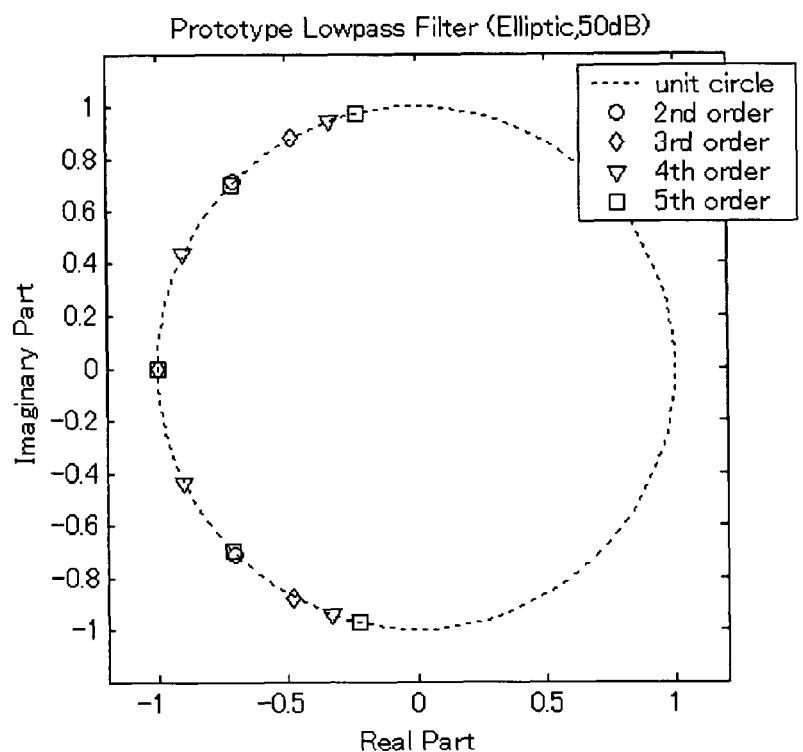
*Fig. 12* pole location of an elliptic filter (*A* = 50 dB)

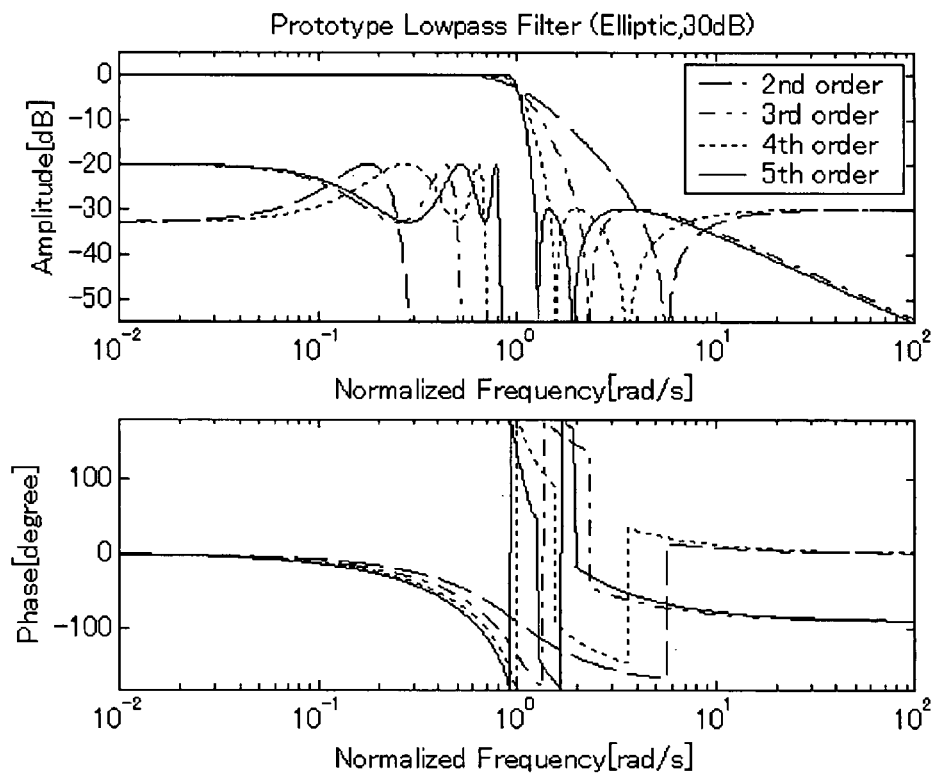
Fig. 13 frequency response of the simultaneous elliptic filter (A = 30 dB)
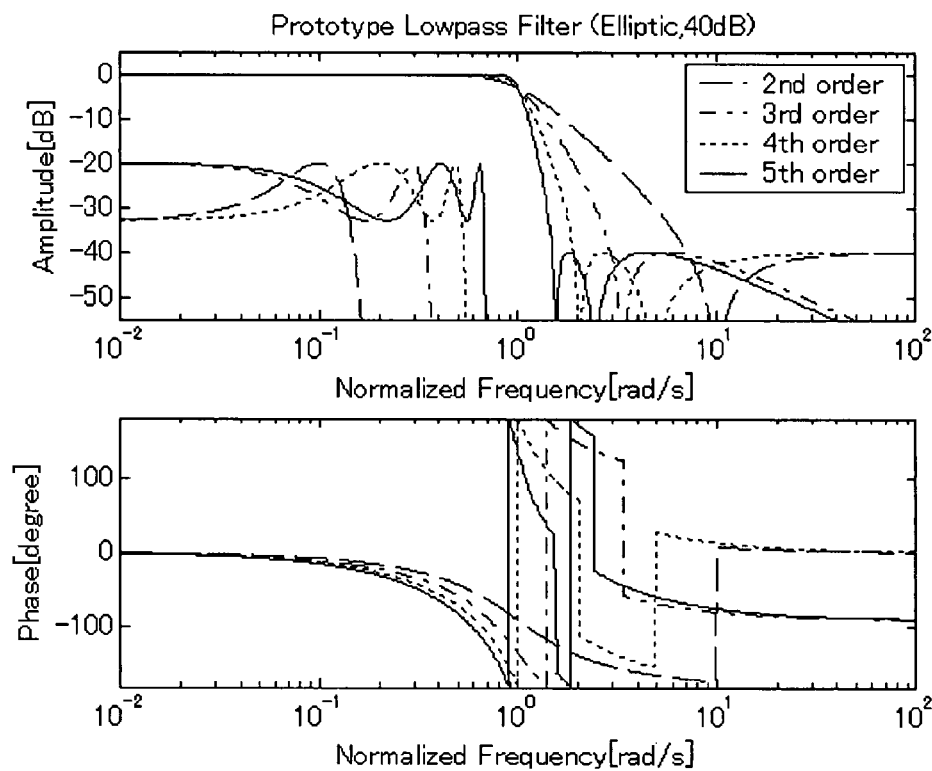
Fig. 14 frequency response of the elliptic filter (A = 40 dB)

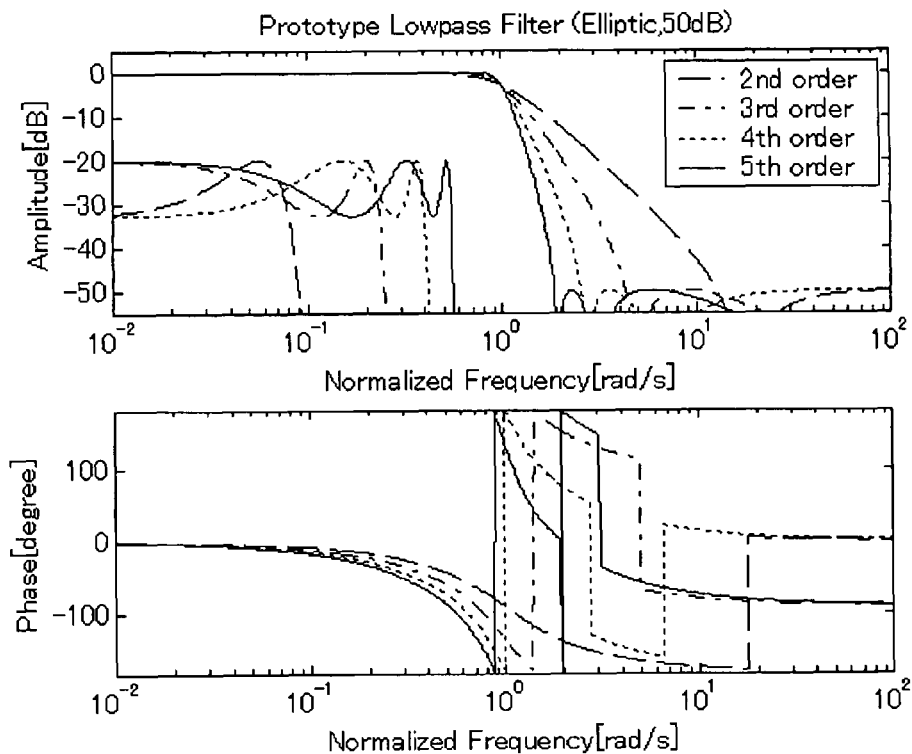
*Fig. 15* frequency response of the elliptic filter ($A = 50$ dB)
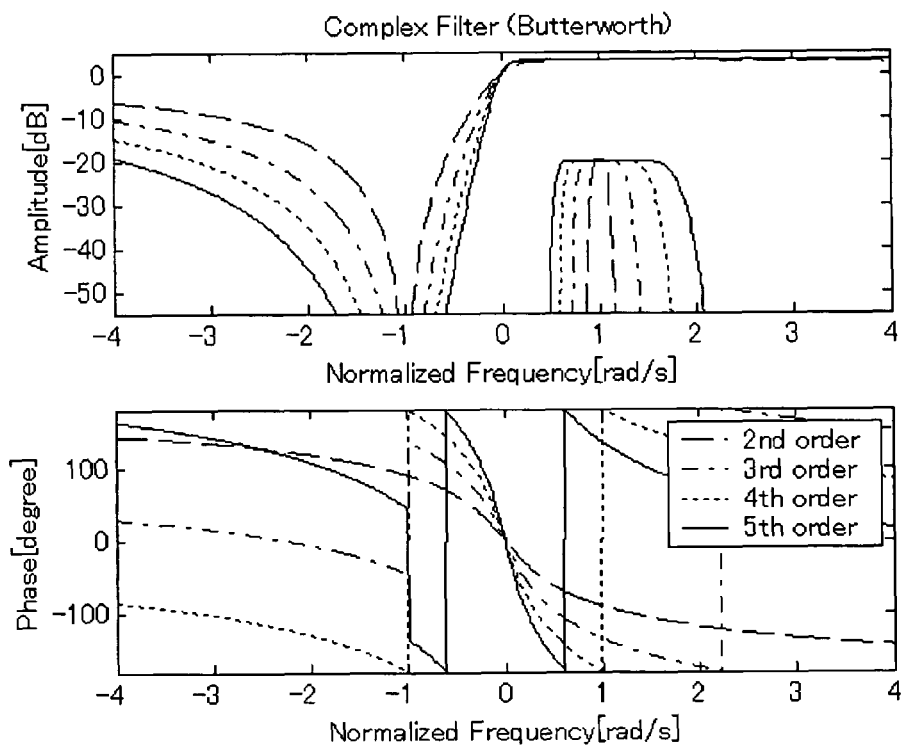
*Fig. 16* frequency response of a complex transfer function based upon the Butterworth filter

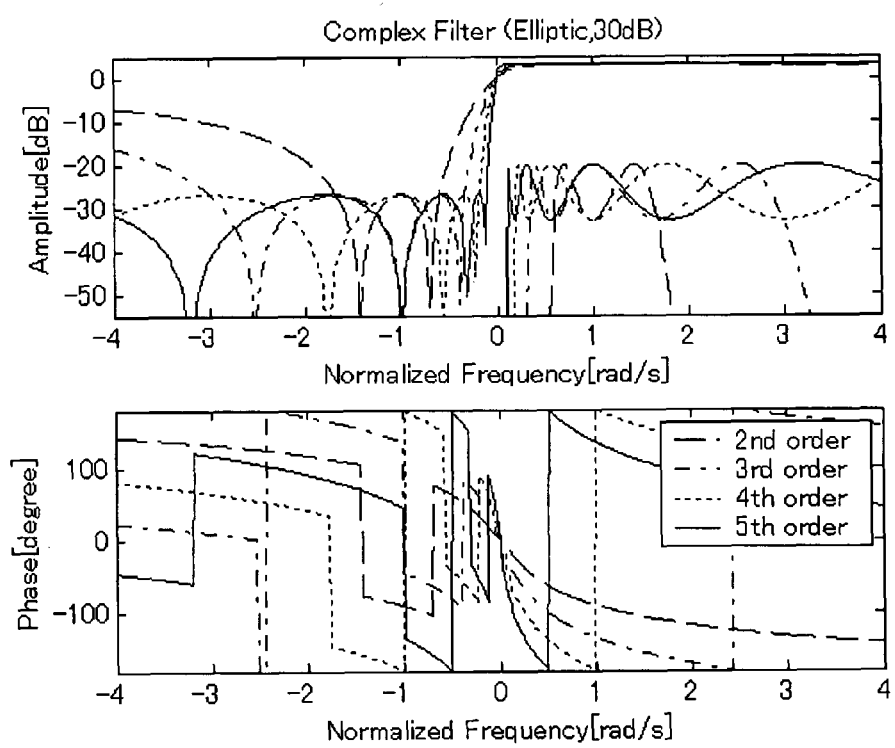
Fig. 17 frequency response of the complex transfer function based upon the elliptic filter ($A$ = 30 dB).
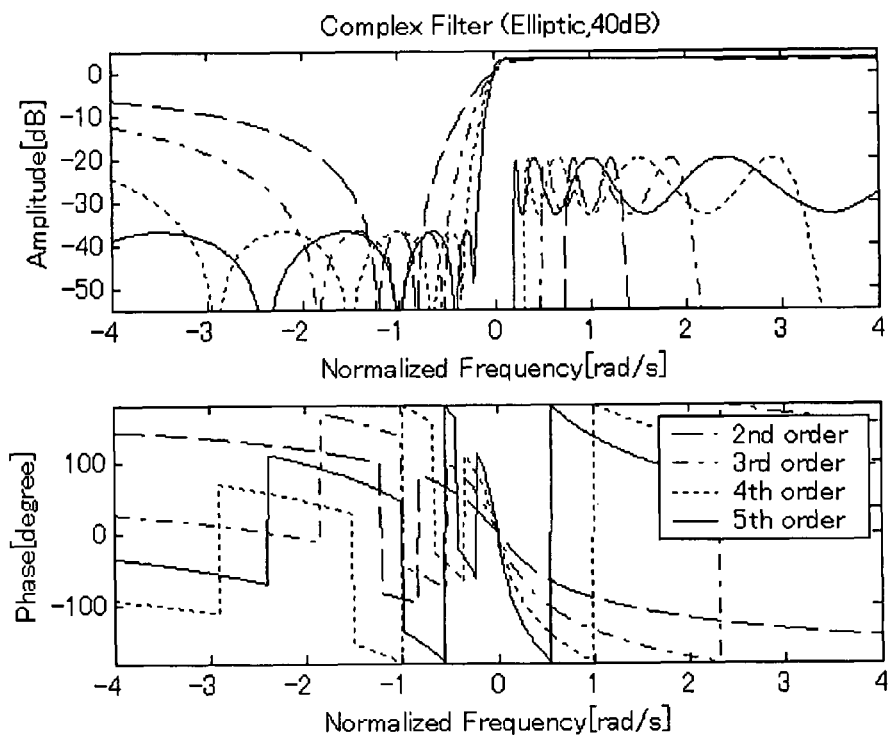
Fig. 18 frequency response of the complex transfer function based upon the elliptic filter ($A$ = 40 dB).

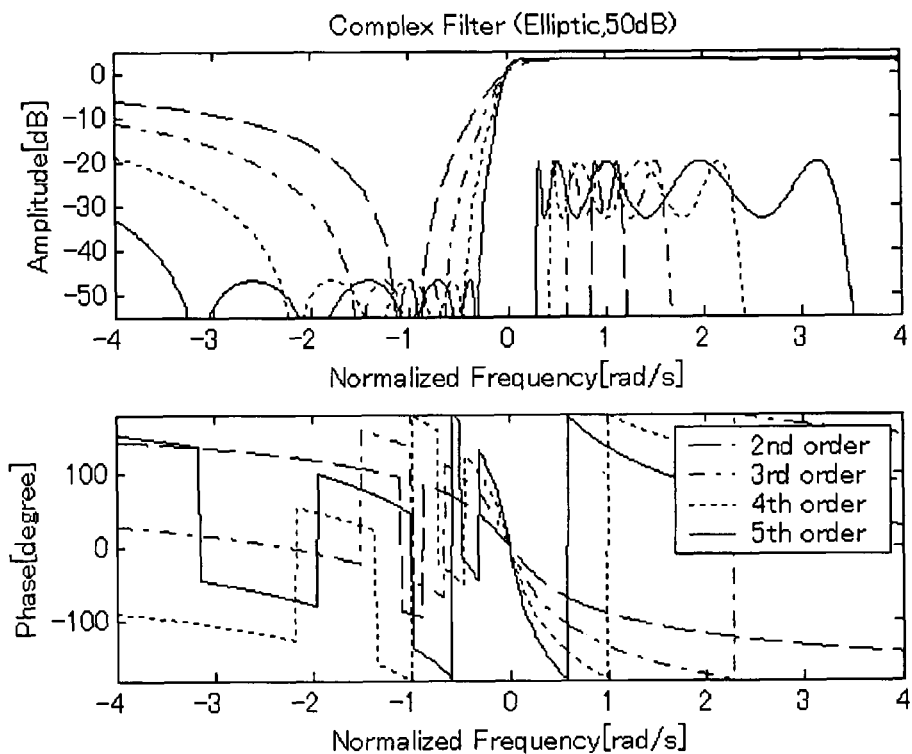
Fig. 19 frequency response of the complex transfer function based upon the elliptic filter ($A = 50$ dB).
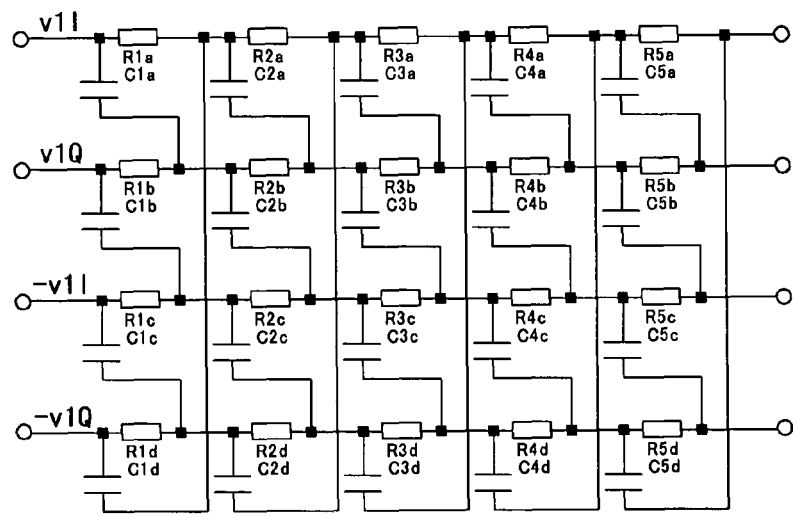
Fig. 20 fifth-order RC polyphase filter

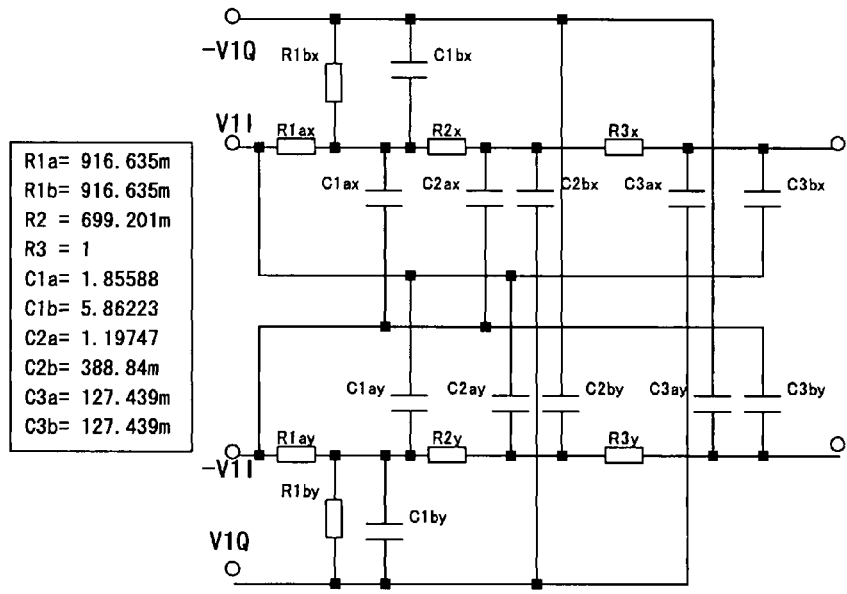
*Fig. 21* Another Embodiment 1 of a third-order complex filter (elliptic filter of A = 30 dB)
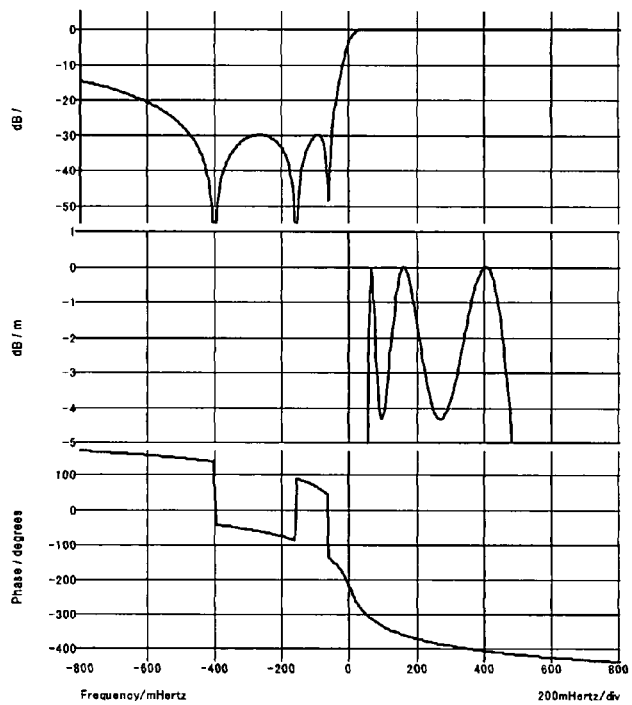
*Fig. 22* frequency response of Another Embodiment 1 of the third-order complex filter

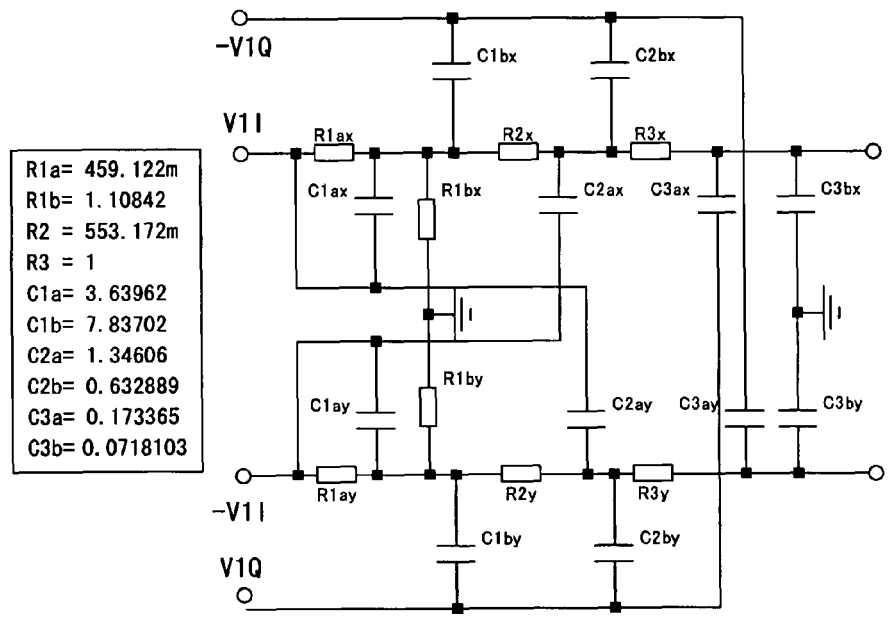
Fig. 23 Another Embodiment 2 of a third-order complex filter (elliptic filter of A = 30 dB)
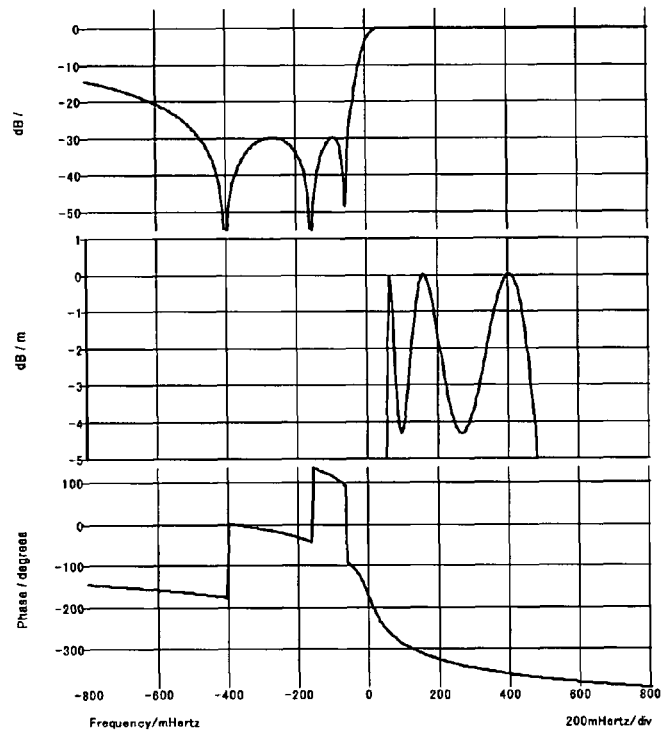
Fig. 24 frequency response of Another Embodiment 2 of the third-order complex filter

METHOD OF DESIGNING PASSIVE RC COMPLEX FILTER OF HARTLEY RADIO RECEIVER

TECHNICAL FIELD

This invention relates to a method of designing a passive RC complex filter employed in a Hartley Image-rejection radio receiver for widening an Image-rejection frequency range.

BACKGROUND OF THE INVENTION

Although heterodyne receivers typically constitute a receiver architecture in currently available radio appliances, those heterodyne receivers have an essential problem of image interference. Image interference is a phenomenon in which two RF signals having a symmetrical relationship between a high frequency side and a low frequency side with respect to a local oscillator frequency "ω0" are converted into the same intermediate frequency (IF) range by a down conversion.

In FIG. 2, for the sake of convenience, it is so assumed that a bandpass filter 100 is not provided. An input signal "X" of a radio frequency band ($\omega_0 + \Delta\omega$) is down-converted by a mixer 101 by utilizing the local oscillator frequency "$\omega_0$". A low frequency component among the mixer output signal is extracted by a lowpass filter 102, whereby an intermediate frequency signal "$v_{1I}$" with "$\Delta\omega$" as a carrier is obtained. On the other hand, if an interference wave "Y" is present on the low frequency side ($\omega_0 - \Delta\omega$), the interference wave "Y" is mixed as represented in Equation 1 and thus cannot be discriminated. As a result, reception performance is deteriorated.

Equation 1

$$v_{RF} = X\cos(\omega_0 t + \Delta\omega t) + Y\cos(\omega_0 t - \Delta\omega t) \quad \text{Equation 1}$$

$$v_{LI} = \cos\omega_0 t$$

$$v_{1I} = \frac{X\cos(\Delta\omega t) + Y\cos(\Delta\omega t)}{2}$$

Normally, in order to prevent the image interference, the bandpass filter 100 which passes only the frequency band ($\omega_0 + \Delta\omega$) is required at a front stage of the mixer. However, since the filter can be hardly integrated and a passband thereof is fixed, it is considerably difficult to apply the bandpass filter to a plurality of radio systems having different bands.

Image-rejection receivers are effective for removing the bandpass filter 100 from the receivers. As one of those effective receiver systems, a Hartley receiver shown in FIG. 3 is known. A basic idea of rejecting an image is expressed in Equation 2. An input signal $v_{RF}$ is quadrature-down-converted by mixers 101 and 104 by employing local oscillator signals $v_{LI}$ and $v_{LQ}$ which are orthogonal to each other. Next, low frequency components $v_{1I}$ and $v_{1Q}$ are extracted by lowpass filters 102 and 105. After one of those signals is shifted by 90 degrees by a phase shifter 106, the phase-shifted signal is added and synthesized with the other signal by adding means 107, whereby the image can be removed. Although a 0-degree phase shifter 103 is inserted in FIG. 3, the lowpass filter 102 may be directly coupled to the adding means 107 in an actual case.

$$v_{LQ} = \sin\omega_0 t \quad \text{Equation 2}$$

$$v_{2I} = v_{1I}$$

$$v_{1Q} = \frac{-X\sin(\Delta\omega t) + Y\sin(\Delta\omega t)}{2},$$

$$v_{2Q} = \frac{X\cos(\Delta\omega t) - Y\cos(\Delta\omega t)}{2}$$

$$v_{IF} = v_{2I} + v_{2Q} = X\cos(\Delta\omega t)$$

In an actual circuit, as shown in FIG. 4, a 45-degree phase shifter 106b is employed instead of the 90-degree phase shifter 106, and a minus 45-degree phase shifter 103b is employed instead of the 0-degree phase shifter 103. These phase shifters 106b and 103b are substituted by a first-order RC lowpass filter and a first-order RC highpass filter in an approximated manner, in which the cut-off frequency is set to $\omega_c = \Delta\omega$. Therefore, the only frequency at which the image can be completely rejected is the frequency of $\omega = \Delta\omega$ in which the amplitude of the lowpass filter is made coincident with the amplitude of the highpass filter. With respect to the above-mentioned image interference and Image-rejection receiver, a detailed description thereof is made in "RF MICROELECTRONICS" edited/translated by Tadahiro Kuroda, MARUZEN, 2002.

It should be noted that when differential mixers 101b and 104b are employed, as shown in FIG. 5, because signals $v_{1I}$, $v_{1Q}$, $-v_{1I}$, and $-v_{1Q}$ of four phases can be obtained, the phases of which are shifted by 90 degrees, respectively, and a polyphase filter 108 can be employed. Four resistance values and four capacitance values are equal to each other. In this case, the adding function is realized by a signal superimposing effect of the polyphase filter. The highpass filtering operation is effected with respect to the signal $v_{1I}$, and the lowpass filtering operation is effected with respect to the signal $v_{1Q}$, which are equivalent to the location of FIG. 4. It should be noted that since the phases of the output signals are merely shifted by 90 degrees, any of the four terminals may be selected.

The bands of the Hartley receivers have been described in a qualitative manner. Quantitatively, as described in "Explicit Transfer Function of RC Polyphase Filter for Wireless Transceiver Analog Front-End" by H. Kobayashi, J. Kang, T. Kitahara, S. Takigami, and H. Sakamura, 2002 IEEE Asia-Pacific Conference on ASICs, pp. 137-140, Taipei, Taiwan (August 2002), it is only necessary that a complex transfer function "H(s)", in which one of a highpass characteristic and a lowpass characteristic is set as a real part "$H_r(s)$" and the other is set as an imaginary part "$H_i(s)$", be defined, and a frequency response be observed. At this time, a negative frequency becomes a response with respect to an image, whereas a positive frequency becomes a response with respect to a desirable wave. The complex transfer function H(s) using a first-order filter is expressed in Equation 3, and a frequency response obtained by normalizing "$\omega_c$" is shown in FIG. 6.

$$H_r(s) = \frac{s}{s+\omega_c}, \; H_i(s) = \frac{\omega_c}{s+\omega_c}, \; H(s) = \frac{s+j\omega_c}{s+\omega_c} \quad \text{Equation 3}$$

Expansion of bandwidth of the Hartley receivers result in designing problems of passive RC complex filters, and higher-order complex transfer functions having wide band frequency responses in both a passband and a stopband must be designed. One of the conventional techniques for designing the higher-order complex transfer functions is described in "Low-IF topologies for high-performance analog front ends of fully integrated receivers" by J. Crols and M. S. Steyaert, IEEE Trans Circuits Syst.-II, vol. 45, pp. 269-282, March 1998.

In the conventional technique, first of all, a proper prototype lowpass characteristic is designed. As to the prototype lowpass characteristic, various sorts of characteristics are known, for instance, a Butterworth filter, and various higher-order characteristics can be readily designed.

Next, a variable transformation is performed with respect to the prototype lowpass filter so as to shift the frequency response to the side of the positive frequency on the frequency axis. Because of the shift operation, a bandpass type complex transfer function with which a positive frequency band becomes a passband and a negative frequency becomes a stopband is obtained. This transfer function succeeds to the shape of the prototype lowpass characteristic. However, with this method, since the transfer function has a complex pole, such a restriction that a passive RC complex filter can only have a negative real pole in a simple root cannot be satisfied. As a result, there is no choice but to realize the prototype lowpass characteristic by an active filter, resulting in demerits in terms of noise and power consumption of active elements.

Another method is described in "RC Polyphase Filter with Flat Gain Characteristic" by Kazuyuki Wada and Yoshiaki Tadokoro, Proceedings of the 2003 IEEE International Symposium on Circuits and Systems, Vol. I, pp. 537-540, May 2003. In this conventional technique, because the element values are directly designed based on the assumption of the structure of the higher-order RC polyphase filter, an active element is not required. However, although the frequency of the transfer zero point, namely, the resistance/capacitance products at the respective stages are clearly given based upon the equi-ripple model, the resistance values are, properly determined based upon the arbitrary constant "$\alpha$." In other words, although the numerator of the transfer function is perfectly designed, the denominator thereof is imperfect. Accordingly, the flatness of the passband cannot be completely guaranteed.

SUMMARY OF THE INVENTION

This invention has been made to overcome drawbacks in the conventional designing methods. That is, an object of this invention is to provide a method of designing a complex transfer function which can be realized in a passive RC complex filter at the same time while perfectly succeeding to the feature of the prototype lowpass characteristic.

In this invention, as a first step, a prototype lowpass transfer function F(p) having a pole on a unit circle is designed. For the F(p), a Butterworth filter (Butterworth characteristic) or a elliptic filter (simultaneous Chebyshev characteristic) in which a maximum passband loss "$\alpha$" and a minimum stopband loss "A" satisfy a condition equation of $\alpha = A/\sqrt{(A^2-1)}$ is employed.

Next, as a second step, a bilinear variable transformation expressed by $p=j(s-j)/(s+j)$ is performed with respect to the prototype transfer function F(p) so as to derive a complex coefficient transfer function G(s). The complex coefficient transfer function G(s) has a pole in a simple root on a negative real axis, and a passband is present in a positive frequency and a stopband is present in a negative frequency.

As a third step, a passive RC complex filter H(s) having a transfer function identical to the complex coefficient transfer function G(s) is designed, and thereafter, an impedance scaling is performed, whereby the designing method is accomplished. The above-mentioned designing flow is shown in FIG. 1.

According to the above-mentioned designing method, while perfectly taking the feature of the prototype lowpass transfer function F(p), a higher-order complex transfer function G(s) which can be realized by a passive RC complex filter can be simultaneously designed. A Hartley receiver using the higher-order complex transfer function G(s) can reject images over a broadband and can maintain flatness with respect to a desirable wave at the same time. In addition, the Hartley receiver is excellent in terms of circuit noise and power consumption, as compared with those using an active filter.

BRIEF DESCRIPTION OF THE DRAWINGS

The present invention can be appreciated by the description which follows in conjunction with the following figures, wherein:

FIG. 1 is a designing flow chart of this invention.

FIG. 2 is a structural diagram of a heterodyne receiver.

FIG. 3 is a structural diagram of a Hartley receiver.

FIG. 4 is a structural diagram of another embodiment of a Hartley receiver.

FIG. 5 shows a polyphase structure of the Hartley receiver.

FIG. 6 shows a frequency response of a first-order complex filter.

FIG. 7 shows a pole location of a Butterworth filter.

FIG. 8 shows a frequency response of the Butterworth filter.

FIG. 9 shows a relationship to be satisfied by a maximum passband loss "$\alpha$" and a minimum stopband loss "A".

FIG. 10 shows a pole location of an elliptic filter (A=30 dB).

FIG. 11 shows a pole location of the elliptic filter (A=40 dB).

FIG. 12 shows a pole location of the elliptic filter (A=50 dB).

FIG. 13 shows a frequency response of the elliptic filter (A=30 dB).

FIG. 14 shows a frequency response of the elliptic filter (A=40 dB).

FIG. 15 shows a frequency response of the elliptic filter (A=50 dB).

FIG. 16 shows a frequency response of a complex transfer function based upon the Butterworth filter.

FIG. 17 shows a frequency response of the complex transfer function based upon the elliptic filter (A=30 dB).

FIG. 18 shows a frequency response of the complex transfer function based upon the elliptic filter (A=40 dB).

FIG. 19 shows a frequency response of the complex transfer function based upon the elliptic filter (A=50 dB).

FIG. 20 shows a fifth-order RC polyphase filter.

FIG. 21 shows Another Embodiment 1 of a third-order complex filter (elliptic filter of A=30 dB).

FIG. 22 shows a frequency response of Another Embodiment 1 of the third-order complex filter.

FIG. 23 shows Another Embodiment 2 of the third-order complex filter (elliptic filter of A=30 dB).

FIG. 24 shows a frequency response of Another Embodiment 2 of the third-order complex filter.

DESCRIPTION OF THE PREFERRED EMBODIMENTS

First, a description is made of a prototype lowpass transfer function "F(p)" having a pole on a unit circumference. A first characteristic corresponds to a Butterworth characteristic. A transfer function of an n-th order Butterworth filter in which a power half value (3-dB loss) frequency is normalized is expressed by the following equation:

$$F(p) = \begin{cases} \dfrac{1}{p+1} \displaystyle\prod_{k=1}^{(n-1)/2} \dfrac{1}{p^2 + 2p\sin\left(\dfrac{2k-1}{2n}\pi\right)+1}, & n \in \text{odd} \\ \displaystyle\prod_{k=1}^{n/2} \dfrac{1}{p^2 + 2p\sin\left(\dfrac{2k-1}{2n}\pi\right)+1}, & n \in \text{even} \end{cases}, \quad p = j\Omega$$

Equation 4

A second-order Butterworth transfer function to a fifth-order Butterworth transfer function are designed, and coefficients of respective terms are expressed in the following table when the transfer function $F(p)$ is represented by a rational function form as shown in the following equation:

$$F(p) = \frac{1}{\sum_{k=0}^{n} d_k p^k}$$

Equation 5

TABLE 1 coefficients of Butterworth transfer function

|  | Second | Third | Fourth | Fifth |
|---|---|---|---|---|
| $d_0$ | 1.00000000000000 | 1.00000000000000 | 1.00000000000000 | 1.00000000000000 |
| $d_1$ | 1.41421356237310 | 2.00000000000000 | 2.61312592975275 | 3.23606797749979 |
| $d_2$ | $=d_0$ | $=d_1$ | 3.41421356237310 | 5.23606797749979 |
| $d_3$ |  | $=d_0$ | $=d_1$ | $=d_2$ |
| $d_4$ |  |  | $=d_0$ | $=d_1$ |
| $d_5$ |  |  |  | $=d_0$ |
| Power half frequency | 1 | 1 | 1 | 1 |

A pole location of Butterworth filters is shown in FIG. 7, and a frequency response is indicated in FIG. 8. In FIG. 8, such a condition that a passband response has been enlarged 0.3 million times larger than the original passband response is additionally represented. It should be noted that details of the above-mentioned designing method of the Butterworth filters are described in "STRUCTURE OF CIRCUIT NETWORK" written by Masamitsu Kawakami issued by KYORITSU Publisher in 1955.

As the second, an elliptic filter is listed up. In order to describe the elliptic filter, an elliptic function is required, so that this elliptic function will now be briefly described. First, the Jacobian elliptic function is defined by the following equation:

$$z = \int_0^x \frac{dx}{\sqrt{(1-x^2)(1-k^2x^2)}}$$

Equation 6

$$sn(z, k) = x$$

$$cn(z, k) = \sqrt{1 - sn(z,k)^2}$$

$$dn(z, k) = \sqrt{1 - k^2 sn(z,k)^2}$$

Subsequently, first kind complete elliptic integrals are defined by the following equation:

$$K(k) = \int_0^1 \frac{dx}{\sqrt{(1-x^2)(1-k^2x^2)}}$$

Equation 7

While various sorts of specific values of elliptic functions are known, the specific values required in this case are given as follows:

$$k_2 = \sqrt{1 - k_1^2},$$

$$sn\left(\frac{K(k_2)}{2}, k_2\right) = \frac{1}{\sqrt{1+k_1}},$$

$$cn\left(\frac{K(k_2)}{2}, k_2\right) = \sqrt{\frac{k_1}{1+k_1}}$$

Equation 8

While the above-mentioned items are prepared, various sorts of parameters will now be defined which are required so as to describe the pole location of the elliptic filter. First of all, $L_1$ and $L_2$ are defined from both a maximum passband loss "$\alpha$" and a minimum stopband loss "A" in accordance with the following equation:

$$L_1 = \sqrt{\frac{\alpha^2 - 1}{A^2 - 1}}, \quad L_2 = \sqrt{1 - L_1^2}$$

Equation 9

Next, as solutions of the following equation, parameters "$k_1$" and "$k_2$" are defined. In this equation, "n" indicates an order of the transfer function. It should be noted that the parameter "$k_1$" is called a "selectivity", while there is such a relationship that a passband edge frequency is $\sqrt{k_1}$, and a stopband edge frequency is $1/\sqrt{k_1}$.

$$k_2 = \sqrt{1 - k_1^2}, \quad n\frac{K(k_2)}{K(k_1)} = \frac{K(L_2)}{K(L_1)}$$

Equation 10

Also, as a solution of the following equation, a parameter "$\xi_0$" is determined.

$$sn(\xi_0 K(L_2), L_2) = 1/\alpha$$

Equation 11

The transfer function F(p) of the elliptic filter is given by the following equation by employing the above-mentioned parameters:

$$a_0 = \sqrt{k_1}\, \frac{sn(\xi_0 K(k_2), k_2)}{cn(\xi_0 K(k_2), k_2)},$$

$$\zeta_k = \sqrt{k_1}\, sn\left(\frac{n-2k+1}{n} K_1, k_1\right)$$

$$\tau_k = \frac{a_0 \zeta_k + \dfrac{1}{a_0 \zeta_k}}{\sqrt{\left(a_0 - \dfrac{1}{a_0}\right)^2 + \left(\zeta_k + \dfrac{1}{\zeta_k}\right)^2}},$$

$$Q_k = \frac{1}{2} \sqrt{\frac{\left(a_0 - \dfrac{1}{a_0}\right)^2 + \left(\zeta_k + \dfrac{1}{\zeta_k}\right)^2}{\left(\zeta_k + \dfrac{1}{\zeta_k}\right)^2 - \left(\sqrt{k_1} + \dfrac{1}{\sqrt{k_1}}\right)^2}}$$

Equation 12

A detailed content as to the above-mentioned method of designing the elliptic filter is described in "APPROXIMATION AND STRUCTURE" written by Masamitsu Kawakami and Hiroshi Shibayama, published by KYORITSU publisher in 1960.

In a general-purpose design of the elliptic filter, since the maximum passband loss α and the minimum stopband loss A are independently selected, no pole is arranged on a unit circle. However, in the case where a restriction condition of Equation 13 is given between α and A, a pole is arranged on the unit circle. FIG. 9 represents a graph in which a relationship between α and A is plotted.

$$\alpha = A/\sqrt{A^2 - 1}$$

Equation 13

At this time, since the following equation can be established based upon Equation 11, it is determined that $\xi_0 = \frac{1}{2}$ from the specific value of the elliptic function of Equation 8:

$$sn(\zeta_0 K(L_2), L_2) = \frac{1}{\alpha} = \frac{1}{\sqrt{1+L_1}}$$

Equation 14

Furthermore, due to the specific value relationship of the elliptic function, $\alpha_0 = 1$, and since $\alpha_0 = 1$, $T_k = 1$.

$$a_0 = \sqrt{k_1}\, \frac{sn(K(k_2)/2, k_2)}{cn(K(k_2)/2, k_2)}$$

$$= \sqrt{k_1}\, \frac{1}{\sqrt{1+k_1}} \bigg/ \sqrt{\frac{k_1}{1+k_1}}$$

$$= 1$$

$$\tau_k = 1$$

Equation 15

As described above, also in the elliptic filter, since the restriction condition of Equation 13 is added, all of the poles are represented as being arranged on the unit circle of the complex plane.

In this case, with respect to 3 conditions in which the minimum stopband loss "A" is 30 dB, 40 dB, and 50 dB, when a second-order elliptic filter transfer function F(p) to a fifth-order elliptic filter transfer function F(p) are designed which satisfy Equation 13, and are expressed by a rational function form as shown in the following equation, coefficients of the respective terms are indicated in the following tables. It should be noted that odd-order terms of a numerator are not present, and are therefore omitted. Also, the passband edge frequency "$\sqrt{k_1}$" and the stopband edge frequency "$1/\sqrt{k_1}$" are additionally expressed:

$$F(p) = \frac{\sum_{k=0}^{n} n_k p^k}{\sum_{k=0}^{n} d_k p^k}$$

Equation 16

Locations of poles of the above-mentioned elliptic filter are indicated in FIGS. 10 to 12, and frequency responses thereof are represented in FIGS. 13 to 15. Also, such conditions that passband responses have been enlarged 3,000, 30,000, and 0.3 million times larger than the original passband responses, respectively, are additionally represented in FIGS. 13 to 15:

TABLE 2

| | coefficients of elliptic filter transfer function (A = 30 dB) | | | |
|---|---|---|---|---|
| | Second | Third | Fourth | Fifth |
| $n_0$ | 0.99949987493746 | 1.00000000000000 | 0.99949987493746 | 1.00000000000000 |
| $n_2$ | 0.03162277660168 | 0.18755860648078 | 0.48766999793704 | 0.88982067836666 |
| $n_4$ | | | 0.03162277660168 | 0.16879048294331 |
| $d_0$ | 1.00000000000000 | 1.00000000000000 | 1.00000000000000 | 1.00000000000000 |
| $d_1$ | 1.36878491917677 | 1.81244139351922 | 2.12871347620239 | 2.34416832262638 |
| $d_2$ | $=d_0$ | $=d_1$ | 2.76855811323175 | 3.62313812720303 |
| $d_3$ | | $=d_0$ | $=d_1$ | $=d_2$ |
| $d_4$ | | | $=d_0$ | $=d_1$ |
| $d_5$ | | | | $=d_0$ |
| Passband edge | 0.251424 | 0.498116 | 0.687714 | 0.814772 |
| Stopband edge | 3.97735 | 2.00757 | 1.45409 | 1.22734 |

TABLE 3 coefficients of elliptic filter transfer function (A = 40 dB)

|  | Second | Third | Fourth | Fifth |
|---|---|---|---|---|
| $n_0$ | 0.99994999874994 | 1.00000000000000 | 0.99994999874994 | 1.00000000000000 |
| $n_2$ | 0.01000000000000 | 0.08757363361565 | 0.28004915242507 | 0.58396659682018 |
| $n_4$ |  |  | 0.01000000000000 | 0.07010011281415 |
| $d_0$ | 1.00000000000000 | 1.00000000000000 | 1.00000000000000 | 1.00000000000000 |
| $d_1$ | 1.40000071430339 | 1.91242636638435 | 2.34495203998657 | 2.67608110309858 |
| $d_2$ | $=d_0$ | $=d_1$ | 3.03223567606022 | 4.16221461909255 |
| $d_3$ |  | $=d_0$ | $=d_1$ | $=d_2$ |
| $d_4$ |  |  | $=d_0$ | $=d_1$ |
| $d_5$ |  |  |  | $=d_0$ |
| Passband edge | 0.141418 | 0.341417 | 0.526583 | 0.673852 |
| Stopband edge | 7.07124 | 2.92897 | 1.89903 | 1.48401 |

TABLE 4 coefficients of elliptic filter transfer function (A = 50 dB)

|  | Second | Third | Fourth | Fifth |
|---|---|---|---|---|
| $n_0$ | 0.99999499998750 | 1.00000000000000 | 0.99999499998750 | 1.00000000000000 |
| $n_2$ | 0.00316227766017 | 0.04070140396463 | 0.15855315179443 | 0.37465098565403 |
| $n_4$ |  |  | 0.00316227766017 | 0.02839050382652 |
| $d_0$ | 1.00000000000000 | 1.00000000000000 | 1.00000000000000 | 1.00000000000000 |
| $d_1$ | 1.40973435533261 | 1.95929859603537 | 2.46389807479992 | 2.88652672542544 |
| $d_2$ | $=d_0$ | $=d_1$ | 3.19445060961793 | 4.54026624359793 |
| $d_3$ |  | $=d_0$ | $=d_1$ | $=d_2$ |
| $d_4$ |  |  | $=d_0$ | $=d_1$ |
| $d_5$ |  |  |  | $=d_0$ |
| Passband edge | 0.0795269 | 0.232913 | 0.39756 | 0.54435 |
| Stopband edge | 12.5744 | 4.29344 | 2.51534 | 1.83705 |

Next, a complex transfer function "G(s)" is derived. In general, a transfer function "F(p)" of a prototype lowpass characteristic having a pole on a unit circle is expressed by the following equation:

$$F(p) = \begin{cases} \dfrac{1}{p+1} \displaystyle\prod_{k=1}^{(n-1)/2} \dfrac{\zeta_k^2 p^2 + 1}{p^2 + \dfrac{p}{Q_k} + 1}, & n \in \text{odd} \\ A_0 \displaystyle\prod_{k=1}^{n/2} \dfrac{\zeta_k^2 p^2 + 1}{p^2 + \dfrac{p}{Q_k} + 1}, & n \in \text{even} \end{cases} \quad \text{Equation 17}$$

A bilinear variable transformation is defined based upon Equation 18. If Equation 18 is solved with respect to "ω", then responses with respect to Ω=0 and Ω=∞ of a prototype lowpass characteristic "H(p)" are mapped to ω=1 and ω=−1, respectively. As a consequence, such a new transfer function G(s) that an area in the vicinity of ω=1 corresponds to a passband and an area in the vicinity of ω=−1 corresponds to a stopband is obtained. Similarly, responses with respect to power half value frequencies Ω=−1 and Ω=1 of the Butterworth filter are mapped to ω=0 and ω=∞, respectively. A passband edge frequency Ω=±√k₁ and a stopband edge frequency Ω=±1/√k₁ of the elliptic filter are mapped to ω=(1±√k₁)/(1∓√k₁) and ω=(±1√k₁)/(□1+√k₁), respectively.

$$p = j\Omega = j\frac{\omega - 1}{\omega + 1} = j\frac{s - j}{s + j}, \omega = \frac{1 + \Omega}{1 - \Omega} \quad \text{Equation 18}$$

Since the prototype lowpass transfer function F(p) can be decomposed to a product of a first-order transfer function and a second-order transfer function, respective function cases thereof will now be described. First, in case of the first-order transfer function, this function can be modified as a form having a negative real pole and a negative zero on an imaginary axis:

$$F(p) = \frac{1}{p+1} \qquad \text{Equation 19}$$

$$G(s) = \frac{(1+j)(-js+1)}{2(s+1)}$$

Next, in case of the second-order transfer function, it is conceivable that the second-order function has a complex pole and thus may be defined as $Q>\frac{1}{2}$, the second-order function may be modified as a form having two different negative real poles and two zeros on an imaginary axis:

$$F(p) = \frac{\zeta^2 p^2 + 1}{p^2 + \frac{p}{Q} + 1}, \zeta < 1, Q > \frac{1}{2} \qquad \text{Equation 20}$$

$$G(s) = \frac{jQ(1-\zeta^2)\left(-js + \frac{1+\zeta}{1-\zeta}\right)\left(-js + \frac{1-\zeta}{1+\zeta}\right)}{(s+2Q-\sqrt{4Q^2-1})(s+2Q+\sqrt{4Q^2-1})}$$

It should be noted that an inverse number relationship of the following equation can be established:

$$\left(\frac{1+\zeta}{1-\zeta}\right)\left(\frac{1-\zeta}{1+\zeta}\right) = 1 \qquad \text{Equation 21}$$

$$(2Q - \sqrt{4Q^2-1})(2Q + \sqrt{4Q^2-1}) = 1$$

As apparent from the foregoing description, the higher-order function may be expressed by the following form:

$$G(s) = \qquad \text{Equation 22}$$

$$\begin{cases} \dfrac{(1+j)(-js+1)}{2(s+1)} \prod_{k=1}^{(n-1)/2} \dfrac{jQ_k(1-\zeta_k^2)\left(-js + \dfrac{1+\zeta_k}{1-\zeta_k}\right)\left(-js + \dfrac{1-\zeta_k}{1+\zeta_k}\right)}{(s+2Q_k - \sqrt{4Q_k^2-1})(s+2Q_k + \sqrt{4Q_k^2-1})}, n \in \text{odd} \\ \dfrac{1}{\alpha}\prod_{k=1}^{n/2} \dfrac{jQ_k(1-\zeta_k^2)\left(-js + \dfrac{1+\zeta_k}{1-\zeta_k}\right)\left(-js + \dfrac{1-\zeta_k}{1+\zeta_k}\right)}{(s+2Q_k - \sqrt{4Q_k^2-1})(s+2Q_k + \sqrt{4Q_k^2-1})}, n \in \text{even} \end{cases}$$

Next, a transfer function "$G_n(s)$" normalized in such a manner that a response in a DC becomes $G(0)=1$ is expressed by the following equation:

$$G_n(s) = \qquad \text{Equation 23}$$

$$\begin{cases} \dfrac{-js+1}{s+1} \prod_{k=1}^{(n-1)/2} \dfrac{\left(-js + \dfrac{1+\zeta_k}{1-\zeta_k}\right)\left(-js + \dfrac{1-\zeta_k}{1+\zeta_k}\right)}{(s+2Q_k - \sqrt{4Q_k^2-1})(s+2Q_k + \sqrt{4Q_k^2-1})}, n \in \text{odd} \\ \prod_{k=1}^{n/2} \dfrac{\left(-js + \dfrac{1+\zeta_k}{1-\zeta_k}\right)\left(-js + \dfrac{1-\zeta_k}{1+\zeta_k}\right)}{(s+2Q_k - \sqrt{4Q_k^2-1})(s+2Q_k + \sqrt{4Q_k^2-1})}, n \in \text{even} \end{cases}$$

Now, results of deriving the complex transfer functions $G_n(s)$ from the prototype lowpass transfer function $F(p)$ shown in Tables 1 to 4 are represented. Tables 5 to 8 represent "$\rho_k$" and "$\sigma_k$" in the order of magnitudes when transfer functions which constitute rational functions are indicated in a factorization form as shown in the following equation. Also, both passband edge frequencies and stopband edge frequencies are additionally expressed. FIGS. 16 to 19 show frequency responses of the complex transfer functions $G_n(s)$. The complex transfer functions $G_n(s)$ derived in accordance with the above-mentioned sequential manners have the same forms as a transfer function "$H(s)$" of an RC polyphase filter described next, and are extremely suitable when those complex transfer functions $G_n(s)$ are realized by the RC polyphase filters:

$$G_n(s) = \frac{\prod_{k=1}^{n} -js + \rho_k}{\prod_{k=1}^{n} s + \sigma_k} \qquad \text{Equation 24}$$

TABLE 5 coefficients of complex transfer function $G_n(s)$ based upon Butterworth filter transfer function

| | Second | Third | Fourth | Fifth |
|---|---|---|---|---|
| $\rho_1$ | 1.00000000000000 | 1.00000000000000 | 1.00000000000000 | 1.00000000000000 |
| $\rho_2$ | $=1/\rho_1$ | 1.00000000000000 | 1.00000000000000 | 1.00000000000000 |
| $\rho_3$ | | $=1/\rho_1$ | $=1/\rho_2$ | 1.00000000000000 |
| $\rho_4$ | | | $=1/\rho_1$ | $=1/\rho_2$ |
| $\rho_5$ | | | | $=1/\rho_1$ |
| $\sigma_1$ | 0.41421356237310 | 0.26794919243112 | 0.19891236737966 | 0.15838444032454 |
| $\sigma_2$ | $=1/\sigma_1$ | 1.00000000000000 | 0.66817863791930 | 0.50952544949443 |
| $\sigma_3$ | | $=1/\sigma_1$ | $=1/\sigma_2$ | 1.00000000000000 |
| $\sigma_4$ | | | $=1/\sigma_1$ | $=1/\sigma_2$ |
| Power half frequency | 0 ∞ | 0 ∞ | 0 ∞ | 0 ∞ |

TABLE 6 coefficients of complex transfer function $G_n(s)$ based upon elliptic filter transfer function (A = 30 dB)

| | Second | Third | Fourth | Fifth |
|---|---|---|---|---|
| $\rho_1$ | 0.69797675554639 | 0.39559514072625 | 0.21874683001089 | 0.12067501274822 |
| $\rho_2$ | $=1/\rho_1$ | 1.00000000000000 | 0.56558329813716 | 0.31267570049614 |
| $\rho_3$ | | $=1/\rho_1$ | $=1/\rho_2$ | 1.00000000000000 |
| $\rho_4$ | | | $=1/\rho_1$ | $=1/\rho_2$ |
| $\rho_5$ | | | | $=1/\rho_1$ |
| $\sigma_1$ | 0.39580532641247 | 0.21226147136004 | 0.11676725879284 | 0.06438566038773 |
| $\sigma_2$ | $=1/\sigma_1$ | 1.00000000000000 | 0.53741012426121 | 0.29569844986088 |
| $\sigma_3$ | | $=1/\sigma_1$ | $=1/\sigma_2$ | 1.00000000000000 |
| $\sigma_4$ | | | $=1/\sigma_1$ | $=1/\sigma_2$ |
| $\sigma_5$ | | | | $=1/\sigma_1$ |
| Passband edge | 1.67174 0.59818 | 2.98498 0.33501 | 5.40438 0.185035 | 9.79753 0.102067 |
| Stopband edge | −1.67174 −0.59818 | −2.98498 −0.33501 | −5.40438 −0.185035 | −9.79753 −0.102067 |

TABLE 7 coefficients of complex transfer function $G_n(s)$ based upon elliptic filter transfer function (A = 40 dB)

| | Second | Third | Fourth | Fifth |
|---|---|---|---|---|
| $\rho_1$ | 0.81817768570152 | 0.54329510726822 | 0.34416957673178 | 0.21634433303010 |
| $\rho_2$ | $=1/\rho_1$ | 1.00000000000000 | 0.65980337319471 | 0.41748312274676 |
| $\rho_3$ | | $=1/\rho_1$ | $=1/\rho_2$ | 1.00000000000000 |
| $\rho_4$ | | | $=1/\rho_1$ | $=1/\rho_2$ |
| $\rho_5$ | | | | $=1/\rho_1$ |
| $\sigma_1$ | 0.40836765910767 | 0.24139917515004 | 0.15012686492035 | 0.09409853793590 |
| $\sigma_2$ | $=1/\sigma_1$ | 1.00000000000000 | 0.59497034502798 | 0.37045133579411 |
| $\sigma_3$ | | $=1/\sigma_1$ | $=1/\sigma_2$ | 1.00000000000000 |
| $\sigma_4$ | | | $=1/\sigma_1$ | $=1/\sigma_1$ |
| $\sigma_5$ | | | | $=1/\sigma_1$ |
| Passband edge | 1.32942 0.752207 | 2.03682 0.49096 | 3.22461 0.310115 | 5.13218 0.194849 |
| Stopband edge | −1.32942 −0.752207 | −2.03682 −0.49096 | −3.22461 −0.310115 | −5.13218 −0.194849 |

TABLE 8 coefficients of complex transfer function $G_n(s)$ based upon elliptic filter transfer function (A = 50 dB)

| | Second | Third | Fourth | Fifth |
|---|---|---|---|---|
| $\rho_1$ | 0.89351931756594 | 0.66424534282358 | 0.46237671890669 | 0.31680598422688 |
| $\rho_2$ | $=1/\rho_1$ | 1.00000000000000 | 0.73466322053635 | 0.50970592309918 |
| $\rho_3$ | | $=1/\rho_1$ | $=1/\rho_2$ | 1.00000000000000 |
| $\rho_4$ | | | $=1/\rho_1$ | $=1/\rho_2$ |
| $\rho_5$ | | | | $=1/\rho_1$ |

TABLE 8-continued coefficients of complex transfer function $G_n(s)$ based upon elliptic filter transfer function (A = 50 dB)

| | Second | Third | Fourth | Fifth |
|---|---|---|---|---|
| $\sigma_1$ | 0.41236235079214 | 0.25547773338925 | 0.17068162020138 | 0.11590091661920 |
| $\sigma_2$ | $=1/\sigma_1$ | 1.00000000000000 | 0.62718707448377 | 0.42041290766453 |
| $\sigma_3$ | | $=1/\sigma_1$ | $=1/\sigma_2$ | 1.00000000000000 |
| $\sigma_4$ | | | $=1/\sigma_1$ | $=1/\sigma_2$ |
| $\sigma_5$ | | | | $=1/\sigma_1$ |
| Passband edge | 1.1728 | 1.60727 | 2.31983 | 3.38934 |
| | 0.852663 | 0.622174 | 0.431065 | 0.295043 |
| Stopband edge | −1.1728 | −1.60727 | −2.31983 | −3.38934 |
| | −0.852663 | −0.622174 | −0.431065 | −0.295043 |

FIG. 20 indicates an example of a fifth-order RC polyphase filter. In this example, 5 stages of the RC polyphase filter 108 shown in FIG. 5 are connected in a cascade connection manner. It should be noted that suffixes "a" to "d" imply same element values, for instance, $R_{1a}=R_{1b}=R_{1c}=R_{1d}=R_1$. In the case of realizing a fourth-order characteristic, it may be conceived that $R_5$ is shortcircuited, and $C_5$ is opened. This technical idea may be similarly applied to a third-order characteristic and a second-order characteristic.

A chain matrix "$m_i$" of the RC polyphase filter per stage is given by the following equation. When "n" stages of the RC polyphase filters are connected in the cascade connection manner, the resultant RC polyphase filters become a product "M" of the respective chain matrixes, and a transfer function H(s) is obtained by an inverse number of a 1-row 1-column element of the product "M." A denominator D(s) constitutes an n-order polynomial of "s." However, there is such a restriction that the denominator D(s) can have only a negative real simple root "$-\lambda A_i$", while the restriction is caused by a passive RC circuit. It should be noted that when it is considered that all capacitors are opened in a DC in view of a nature of a circuit, the DC gain becomes H(0)=1.

$$m_i = \frac{1}{-js+\omega_i}\begin{pmatrix} s+\omega_i & R_i\omega_i \\ 2\frac{s}{R_i} & s+\omega_i \end{pmatrix}, \omega_i = \frac{1}{C_iR_i} \quad \text{Equation 25}$$

$$M = \prod_{i=1}^{n} m_i$$

$$H(s) = \frac{1}{M_{11}} = \frac{\prod_{i=1}^{n}-js+\omega_i}{D(s)} = \prod_{i=1}^{n}\frac{-js+\omega_i}{s+\lambda_i}$$

In the beginning, a numerator polynomial is determined. "ω" may be directly adapted with respect to "ρ" which has already been designed. As to a denominator polynomial D(s), "n" sorts of resistance values must be determined.

First, the transfer function H(s) is a non-dimensional amount, and an impedance level is indefinite, so any one of the resistance values is arbitrarily determined. Similar to the case of the numerator polynomial, if "λ" may be directly adapted to "σ", then the denominator polynomial D(s) becomes preferable. However, normally, the denominator polynomial D(s) has a form which can be hardly factorized. As a consequence, the denominator polynomial is once expanded so as to equally arrange coefficients from a first-order term up to an (n−1)-order term, and (n−1) pieces of simultaneous equations related to the remaining (n−1) sorts of resistance values may be solved.

On the other hand, in the above-described methods, several different sorts of solutions are obtained depending upon corresponding sequences between "ρ" and "ω." There are some possibilities that a negative resistance value may be obtained depending upon the corresponding sequence. However, a circuit cannot be realized by employing this negative resistance value. As a result, "ρ" should be combined with "ω" by repeating trial and error until a positive resistance value is obtained. If all of element values are positive, any of solutions may be employed. However, if an extent of element values is narrow, an RC polyphase filter is easily manufactured.

While such a case of a third-order elliptic filter of a minimum stopband loss (=30 dB) is exemplified, a description is made of a specific example of the above-mentioned design sequence. First, "ρ" is read from Table 6, and the read "ρ" is adapted to "ω" in the following manner:

$$\omega_1=\rho_3=1/\rho_1$$

$$\omega_2=\rho_2=1$$

$$\omega_3=\rho_1=0.39559514072625 \quad \text{Equation 26}$$

Also, "σ" is read from Table 6 so as to form the following polynomials:

$$\sigma_1=0.21226147136004$$

$$\sigma_2=1$$

$$\sigma_3=1/\sigma_1$$

$$(s+\sigma_1)(s+\sigma_2)(s+\sigma_3)=s^3+5.92343s^2+5.92343s+1 \quad \text{Equation 27}$$

On the other hand, the denominator polynomial D(s) of the RC polyphase filter transfer function is calculated from the chain matrix M so as to obtain the following equation with respect to unknown variables $R_1$, $R_2$, and $R_3$.

$$D(s) = s^3 + \left(3.92343+2\frac{R_2}{R_3}+5.05567\frac{R_1}{R_2}+5.05567\frac{R_1}{R_3}\right)s^2 + \left(3.92343+5.05567\frac{R_2}{R_3}+2\frac{R_1}{R_2}+5.05567\frac{R_1}{R_3}\right)s+1 \quad \text{Equation 28}$$

For example, when $R_2=1$, if the above-mentioned two polynomials are calculated by equally arranging coefficients, then the following element values are obtained:

$$R_1 = 0.241626, C_1 = \frac{1}{\omega_1 R_1} = 1.63722 \quad \text{Equation 29}$$

-continued $$R_2 = 1.00000, C_2 = \frac{1}{\omega_2 R_2} = 1.00000$$

$$R_3 = 4.13863, C_3 = \frac{1}{\omega_3 R_3} = 0.610791$$

As other examples than the above-mentioned example, even when "ω" and "ρ" are combined with each other in the following manner, the element values are obtained. It should be noted that in this designing example, solutions obtained from combinations except the above-listed combinations are improper:

$$\rho_1 = \omega_1, \rho_2 = \omega_2, \rho_3 = \omega_3 \quad \text{Equation 30}$$

-continued $$R_1 = 0.610791, C_1 = \frac{1}{\omega_1 R_1} = 4.13863$$

$$R_2 = 1.00000, C_2 = \frac{1}{\omega_2 R_2} = 1.00000$$

$$R_3 = 1.63722, C_3 = \frac{1}{\omega_3 R_3} = 0.241626$$

Tables 9 to 12 represent results obtained by designing one set of respective element values of each of RC polyphase filters which correspond to the complex transfer functions shown in Tables 5 to 8:

TABLE 9 element values of RC polyphase filter based upon Butterworth filter

| Element | Second | Third | Fourth | Fifth |
|---|---|---|---|---|
| $R_1$ | 0.64359425349784 | 0.41421356087532 | 0.26263785564678 | 0.16375128723073 |
| $R_2$ | 1.55377397260020 | 1.00000000000000 | 0.72041067071902 | 0.52337021220961 |
| $R_3$ | short | 2.41421357110275 | 1.38809715158984 | 1.00000000000000 |
| $R_4$ | short | short | 3.80752423346349 | 1.91069338046219 |
| $R_5$ | short | short | short | 6.10682222357714 |
| $C_1$ | 1.55377397260020 | 2.41421357110275 | 3.80752423346349 | 6.10682222357714 |
| $C_2$ | 0.64359425349784 | 1.00000000000000 | 1.38809715158984 | 1.91069338046219 |
| $C_3$ | open | 0.41421356087532 | 0.72041067071902 | 1.00000000000000 |
| $C_4$ | open | open | 0.26263785564678 | 0.52337021220961 |
| $C_5$ | open | open | open | 0.16375128723073 |

TABLE 10 element values of RC polyphase filter based upon ellipfic filter (A = 30 dB)

| Element | Second | Third | Fourth | Fifth |
|---|---|---|---|---|
| $R_1$ | 0.75304397105968 | 0.24162597031569 | 0.33366794524870 | 0.41260857823334 |
| $R_2$ | 1.32794370372929 | 1.00000000000000 | 0.35246374955489 | 0.66068347447247 |
| $R_3$ | short | 4.13862797402734 | 2.83717120203952 | 1.00000000000000 |
| $R_4$ | short | short | 2.99699151278867 | 1.51358409683011 |
| $R_5$ | short | short | short | 2.42360448316828 |
| $C_1$ | 1.90256149974913 | 1.63722111983061 | 5.29893920302088 | 20.0837309064003 |
| $C_2$ | 0.52560718806297 | 1.00000000000000 | 0.62062220626902 | 4.84074744033116 |
| $C_3$ | open | 0.61079104580789 | 1.61128620584120 | 1.00000000000000 |
| $C_4$ | open | open | 0.18871701706445 | 0.20657966818686 |
| $C_5$ | open | open | open | 0.04979154543847 |

TABLE 11 element values of RC polyphase filter based upon elliptic filter (A = 40 dB)

| | Second | Third | Fourth | Fifth |
|---|---|---|---|---|
| $R_1$ | 0.70648322773701 | 0.29546774333741 | 0.31370046094607 | 0.34254991318114 |
| $R_2$ | 1.41546176998876 | 1.00000000000000 | 0.43780378816174 | 0.58616216517890 |
| $R_3$ | short | 3.38446420142063 | 2.28412824886425 | 1.00000000000000 |
| $R_4$ | short | short | 3.18775432138081 | 1.70601253271744 |
| $R_5$ | short | short | short | 2.91928259655167 |
| $C_1$ | 1.73001756983233 | 1.83876283908604 | 4.83137015459159 | 13.4936864565018 |
| $C_2$ | 0.57802881163624 | 1.00000000000000 | 0.78612745219849 | 4.08642275522316 |
| $C_3$ | open | 0.54384392524326 | 1.27205836305982 | 1.00000000000000 |
| $C_4$ | open | open | 0.20698062206011 | 0.24471281115539 |
| $C_5$ | open | open | open | 0.07410873249676 |

TABLE 12 element values of RC polyphase filter based upon elliptic filter (A = 50 dB)

|       | Second            | Third            | Fourth           | Fifth             |
|-------|-------------------|------------------|------------------|-------------------|
| $R_1$ | 0.67934053603608  | 0.33264060203185 | 0.30081837896762 | 0.29901339074397  |
| $R_2$ | 1.47201579613510  | 1.00000000000000 | 0.50122337594968 | 0.48482839457192  |
| $R_3$ | short             | 3.00624756536561 | 1.99511844016707 | 1.00000000000000  |
| $R_4$ | short             | short            | 3.32426497154830 | 2.06258546569443  |
| $R_5$ | short             | short            | short            | 3.34433182912619  |
| $C_1$ | 1.64743589410182  | 1.99688594298967 | 4.52488280157010 | 10.5564035896676  |
| $C_2$ | 0.60700389227904  | 1.00000000000000 | 0.92249631819411 | 4.04661859363080  |
| $C_3$ | open              | 0.50077972831179 | 1.08401516654029 | 1.00000000000000  |
| $C_4$ | open              | open             | 0.22100019908869 | 0.24711990439968  |
| $C_5$ | open              | open             | open             | 0.09472923155181  |

While the various sorts of designing examples have been described above, all of those element values have been normalized. As a result, in an actual apparatus, if ratios of the element values of the elements which constitute a circuit are maintained, then the effect achieved by this embodiment may be obtained. Also, a center of the passband and a center of the stopband are 1 rad/s=0.16 Hz, and −1 rad/s=−0.16 Hz, respectively. In order to apply those centers to an actual circuit, impedance scaling must be performed. First, as to a resistance value, since a standard resistance value is approximately 1 kΩ in view of a circuit design, the resistance value may be uniformly multiplied by, for instance, 1,000. A capacitance value may be determined in accordance with a relationship between a desirable wave and an image. If the capacitance value is uniformly divided by, for example, 1 billion, the centers of the passband and the stopband are multiplied by 1 million, so that those centers are moved to 1 Mrad/s=160 kHz, and −1 Mrad/s=−160 kHz, respectively, and thus, those calculated values become element values suitable for such a case where the desirable wave is apart from the image by 320 kHz.

Although Embodiment 1 has described the designing example based upon the RC polyphase filters, there are other passive RC complex filters capable of realizing the complex transfer function $G_n(s)$. As an example, other modes of passive RC complex filters capable of realizing a third-order complex elliptic filter (A=30 dB) are represented in FIGS. 21 and 23. Suffixes "x" and "y" imply the same element value. As to two output terminals, phases thereof are merely inverted, so that any one of those output terminals may be selected.

Frequency responses of FIGS. 21 and 23 are indicated in FIGS. 22 and 24, respectively. In those drawings, upper stages show amplitude responses, middle stages indicate enlarged diagrams thereof, and lower stages represent phase responses. The same responses as those of FIG. 17 are obtained except that a gain reference is lowered by 3 dB, and an offset of a phase is different.

Since the RC polyphase filter of FIG. 20, or the passive RC complex filter of FIG. 21 or 23, which are designed according to this invention, are employed in the Hartley receiver of FIG. 5, the image interference can be suppressed over the broadband.

The passband of the passive RC complex filter according to this invention becomes flat in the light of the maximum flat model if the Butterworth characteristic is selected as the prototype lowpass characteristic, and also becomes flat in the light of the equi-ripple model if the elliptic filter is selected. Also, the stopband of the passive RC complex filter becomes flat in the light of the maximum flat model if the Butterworth characteristic is selected as the prototype lowpass characteristic, and also becomes flat in the light of the equi-ripple model if the simultaneous Chebyshev characteristic is selected. As a consequence, by employing the passive RC complex filter according to this invention, the superior reception characteristic can be obtained.

INDUSTRIAL APPLICABILITY

This invention can be applied to a radio communication receiving apparatus.

What is claimed is:

1. A method of designing a passive RC complex filter, comprising the steps of:
   designing a lowpass transfer function F(p) for a prototype lowpass filter having poles on a circumference of a unit circle in a complex plane, the lowpass transfer function F(p) corresponding to a real coefficient rational function of second-order or higher related to a complex variable "p";
   deriving a complex transfer function G(s) whose numerator is a complex coefficient and denominator is a real coefficient, and which corresponds to the same-order rational function as the lowpass transfer function F(p) and has poles different from each other on a negative real axis and a zero point on an imaginary axis on the complex plane, by performing a transformation of a variable of p=j(s−j)/(s+j) related to a complex variable "s" with respect to the lowpass transfer function F(p) for the prototype lowpass filter; and
   configuring the passive RC complex filter to include a plurality of filter elements by calculating a complex transfer function H(s) of the same order as the transfer function F(p) and configuring the filter elements with respective elements values such that the filter elements correspond to an equal arrangement of coefficients of the complex transfer function G(s) and the complex transfer function H(s) in the passive RC complex filter.

2. The method of designing a passive RC complex filter according to claim 1, wherein the transfer function F(p) comprises a Butterworth filter.

3. The method of designing a passive RC complex filter according to claim 1, wherein:
   the transfer function F(p) comprises a elliptic filter; and
   a maximum passband loss "α" and a minimum stopband loss "A" satisfy a relational expression defined by $\alpha = A/\sqrt{(A^2-1)}$.

4. The method of designing a passive RC complex filter according to claim 1, wherein the passive RC complex filter comprises an RC polyphase filter having a number of stages same as the order of the complex transfer function G(s).

5. A passive RC complex filter, which is formed by the method comprising the steps of:

designing a lowpass transfer function F(p) for a prototype lowpass filter having poles on a circumference of a unit circle in a complex plane, the lowpass transfer function F(p) corresponding to a real coefficient rational function of second-order or higher related to a complex variable "p";

deriving a complex transfer function G(s) whose numerator is a complex coefficient and denominator is a real coefficient, and which corresponds to the same-order rational function as the lowmass transfer function F(p) and has poles different from each other on a negative real axis and a zero point on an imaginary axis on the complex plane, by performing a transformation of a variable of $p=j(s-j)/(s+j)$ related to a complex variable "s" with respect to the lowpass transfer function F(p) for the prototype lowpass filter; and configuring the passive RC complex filter to include a plurality of filter elements by calculating a complex transfer function H(s) of the same order as the transfer function F(p) and configuring the filter elements with respective elements values such that the filter elements correspond to an equal arrangement of coefficients of the complex transfer function G(s) and the complex transfer function H(s) in the passive RC complex filter.

6. A Hartley type radio receiver, comprising:

a first differential mixer for outputting a first differential signal based upon a first local oscillator signal and a second local oscillator signal having phases that differ from one another by 90 degrees at a frequency $\omega_0$ offset by an intermediate frequency $\Delta\omega$ from a carrier frequency $(\omega_0+\Delta\omega)$ of a received input signal in a radio frequency band, the first differential signal being obtained by converting a frequency of the received input signal by employing the first local oscillator signal;

a second differential mixer for outputting a second differential signal obtained by converting the frequency of the input signal by employing the second local oscillator signal;

a passive RC complex filter for filtering and mixing the output of the first differential mixer and the output of the second differential mixer;

a first lowpass filter and a second lowpass filter for extracting low frequency-side signals from the input signal, the first and second lowpass filters being connected either between the first differential mixer and the passive RC complex filter or to a post stage of the passive RC complex filter; and a third lowpass filter and a fourth lowpass filter for extracting low frequency-side signals from the input signal, the third and fourth lowpass filters being connected between the first differential mixer and the passive RC complex filter or to the post stage of the passive RC complex filter, wherein:

device values of the passive RC complex filter are determined to correspond to an equal arrangement of coefficients of a complex transfer function G(s) and a complex transfer function H(s);

the complex transfer function G(s), which performs a transformation of a variable of $p=j(s-j)/(s+j)$ related to a complex variable "s" with respect to a lowpass transfer function F(p), corresponds to the same-order rational function as the lowpass transfer function F(p) and has poles different from each other on a negative real axis and a zero point on an imaginary axis on the complex plane;

the lowpass transfer function F(p), which has all poles on a circumference of a unit circle in a complex plane, corresponds to a real coefficient rational function of second-order or higher related to the complex variable "p"; and the complex transfer function H(s) corresponds to the same order of the passive RC complex filter as the transfer function F(p).

7. The Hartley type radio receiver according to claim 6, wherein the transfer function F(p) comprises a Butterworth characteristic.

8. The Hartley type radio receiver according to claim 6, wherein:

the transfer function F(p) comprises a simultaneous Chebyshev characteristic; and a maximum passband loss "$\alpha$" and a minimum stopband loss "A" satisfy a relational expression defined by $\alpha=A/\sqrt{(A^2-1)}$.

* * * * *